United States Patent
Tsutsumi et al.

(10) Patent No.: US 11,784,232 B2
(45) Date of Patent: Oct. 10, 2023

(54) FIELD EFFECT TRANSISTOR AND METHOD FOR MANUFACTURING THE SAME

(71) Applicant: Nippon Telegraph and Telephone Corporation, Tokyo (JP)

(72) Inventors: Takuya Tsutsumi, Tokyo (JP); Hideaki Matsuzaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 98 days.

(21) Appl. No.: 17/612,439

(22) PCT Filed: Jun. 4, 2019

(86) PCT No.: PCT/JP2019/022209
§ 371 (c)(1),
(2) Date: Nov. 18, 2021

(87) PCT Pub. No.: WO2020/245922
PCT Pub. Date: Dec. 10, 2020

(65) Prior Publication Data
US 2022/0208980 A1 Jun. 30, 2022

(51) Int. Cl.
*H01L 29/423* (2006.01)
*H01L 29/10* (2006.01)
*H01L 29/66* (2006.01)

(52) U.S. Cl.
CPC .... *H01L 29/42376* (2013.01); *H01L 29/1037* (2013.01); *H01L 29/66621* (2013.01); *H01L 29/66643* (2013.01)

(58) Field of Classification Search
CPC ......... H01L 29/06; H01L 29/10; H01L 29/66; H01L 29/423; H01L 29/205; H01L 29/778; H01L 29/1037; H01L 29/42376; H01L 29/66621; H01L 29/66643; H01L 29/7787; H01L 29/0653; H01L 29/66462; H01L 29/7839; H01L 29/806; H01L 29/0657; H01L 29/417; H01L 29/41725; H01L 29/41791; H01L 29/0843; H01L 29/0891; H01L 29/66636; H01L 21/8234; H01L 21/8238; H01L 21/823814; H01L 21/823418; H01L 21/823425
USPC .......................................................... 257/330
See application file for complete search history.

(56) References Cited

U.S. PATENT DOCUMENTS

| | | | |
|---|---|---|---|
| 2011/0114967 A1* | 5/2011 | Hikita | H01L 29/432 257/E29.091 |
| 2016/0260615 A1* | 9/2016 | Hirai | H01L 29/4238 |
| 2018/0248027 A1* | 8/2018 | Okita | H01L 27/098 |

FOREIGN PATENT DOCUMENTS

JP 3715557 B2 9/2005

* cited by examiner

*Primary Examiner* — Chuong A Luu
(74) *Attorney, Agent, or Firm* — Slater Matsil, LLP

(57) ABSTRACT

A gate opening, a plurality of first openings arranged in a gate widthwise direction and having a reed shape, a second opening connecting the adjacent first openings, and a third opening connected to a side away from the arrangement of the first opening at an end of the arrangement are formed in an insulation layer. An ohmic cap layer is etched via the openings to form an asymmetric recess region.

8 Claims, 14 Drawing Sheets

FIELD EFFECT TRANSISTOR AND METHOD FOR MANUFACTURING THE SAME

This patent application is a national phase filing under section 371 of PCT/JP2019/022209, filed on Jun. 4, 2019, which application is incorporated herein by reference in its entirety.

TECHNICAL FIELD

The present invention relates to a field effect transistor and its manufacturing method.

BACKGROUND ART

Properties of terahertz waves in a frequency band of electromagnetic waves of 0.3 to 3.0 THz hold potential for creating new unprecedented applications, such as high-speed radio communication of more than tens of Gb/s, nondestructive internal inspection by 3-dimensional imaging, and component analysis using electromagnetic wave absorption.

When applications are realized by terahertz waves, better high-frequency properties are also required for electronic devices which constitute such applications. In general, as electronic devices that have good high-frequency characteristics, field effect transistors made of a compound semiconductor material that has considerably high electron mobility in physical properties are used.

Such a field effect transistor includes a semiconductor substrate, a semiconductor laminate structure formed on the semiconductor substrate, a gate electrode formed on the surface of the semiconductor laminate structure, and a source electrode and a drain electrode formed on both sides of the gate electrode. In particular, in a high electron mobility transistor that has excellent high-frequency characteristics, a semiconductor laminate structure includes a buffer layer, a channel layer, a barrier layer, a carrier supply layer, a passivation layer, and an ohmic cap layer stacked in that order from the side of a semiconductor substrate.

In such a type of field effect transistor, when a potential is applied to a gate electrode, carriers are supplied from a carrier supply layer to a channel layer in accordance with intensity of the applied potential, density of a formed 2-dimensional electronic gas is modulated, and electrons are moved through a conduction channel formed between a source electrode and a drain electrode. An electron supply layer and the channel layer in which the conduction channel for the electrons (carriers) to move (travel) is formed are spatially separated and impurity scattering is reduced in the electron supply layer. Therefore, in the above-described field effect transistor, electron mobility can be improved, thereby realizing a high-frequency operation.

To improve high-frequency characteristics of a field effect transistor, it is important to simultaneously reduce drain conductance and source resistance. To reduce the drain conductance, it is effective to reduce a short channel effect or deplete the drain region. To realize the depletion, it is effective to adopt a recess structure. The recess structure is a structure in which the ohmic cap layer around the gate electrode is removed in both directions of the source electrode and the drain electrode and includes the gate electrode forming portion.

It is known that the drain conductance of the field effect transistor can be easily reduced when a structure called an asymmetric recess structure disclosed in Patent Literature 1 is adopted. In the asymmetric recess structure, as disclosed in Patent Literature 1, the drain conductance is reduced by arranging, when the recess region is formed, such that the length of a recess region in a gate lengthwise direction on a drain electrode side is greater than on a source electrode side and depleting carriers across a large region on the drain electrode side (see FIG. 6). In this configuration, the length of the recess region in the gate lengthwise direction on the source electrode side is smaller. Therefore, depletion of the source electrode side can be avoided, and it is possible to achieve a reduction in source resistance simultaneously. These two effects lead to an improvement in high-frequency characteristics of a field effect transistor.

In the technology of Patent Literature 1, an asymmetric recess structure is formed by forming a plurality of asymmetric recess formation openings on a side on which a gate opening and a drain electrode of the gate opening are disposed on an insulation film and performing etching using the insulation film as a mask.

CITATION LIST

Patent Literature

Patent Literature 1: JP 3715557 B

SUMMARY

Technical Problem

However, in the above-described technology of the related art, a width of the asymmetric recess formation opening in a plan view is narrow on the order of a few tens of nm and it is difficult to input an etchant. This problem results in irregularity of an amount of etchant entering from each of the asymmetric recess formation openings, and thus results in deterioration in uniformity of the etching amount from a portion of each opening. An etching speed from the asymmetric recess formation opening is slower than an etching speed from a gate opening with a sufficient opening area, and thus a sufficient etching amount for the asymmetric recess structure cannot be obtained.

On the other hand, when the width of the asymmetric recess forming opening is wider to facilitate permeation of the etchant, a metal deposited in formation of the gate electrode after formation of the recess region is deposited up to the barrier layer of the recess region via the opening, and thus an operation speed may deteriorate due to an increase in parasitic capacitance and an increase in an effective gate length. Further, when the width of the asymmetric recess formation opening is widened, mechanical strength of the insulation film or the gate electrode may deteriorate, and thus reliability may consequently deteriorate.

In the above-described technology, the asymmetric recess amount may be determined by the number of asymmetric recess formation openings. For the areas of the asymmetric recess formation openings, there is no freedom of adjustment because the areas are already arranged to be sufficiently small. Intervals of the asymmetric recess formation openings cannot be reduced over a certain limit because of a resolution restriction (limit) of a lithographic technology, and thus the freedom of design may consequently deteriorate.

As described above, in the technology of the related art, it is not easy to manufacture a field effect transistor that has a favorable asymmetric recess amount with good uniformity and without characteristics deteriorating.

To solve the foregoing problems, an objective of embodiments of the present invention is to form an asymmetric recess structure of a field effect transistor with more freedom of design and with better uniformity.

Means for Solving the Problem

A method of manufacturing a field effect transistor according to an embodiment of the present invention includes: a first step of forming a buffer layer, a channel layer, a barrier layer, a carrier supply layer, and an ohmic cap layer on a semiconductor substrate; a second step of forming a source electrode and a drain electrode separate from each other on the ohmic cap layer; a third step of forming an insulation layer located between the source electrode and the drain electrode on the ohmic cap layer; a fourth step of forming a gate opening located closer to the source electrode than to the drain electrode on the insulation layer; a fifth step of forming a plurality of first openings, a second opening, and a third opening located between the gate opening and the drain electrode in the insulation layer; a sixth step of forming, in regions below the gate opening, the plurality of first openings, the second opening, and the third opening, a recess region in which a part of the ohmic cap layer is removed in directions from the gate opening to the source electrode and to the drain electrode in a plan view by etching the ohmic cap layer using the insulation layer that has the gate opening, the first openings, the second opening, and the third opening as a mask; and a seventh step of forming a gate electrode above the insulation layer, a part of the gate electrode being inserted into the recess region from the gate opening and being Schottky-joined to the barrier layer. The plurality of first openings are arranged in a gate widthwise direction and each have a reed shape in a gate lengthwise direction in a plan view, the second opening has a reed shape in the gate widthwise direction in a plan view and is connected to a first opening of the plurality of first openings, the third opening is provided in a region outside of the arrangement of the plurality of first openings arranged in the gate widthwise direction, is connected to a first opening of the plurality of first openings at an end of the arrangement, and is formed in a shape that has a width that gradually broadens from the first opening at the end of the arrangement in a plan view, and a length of the recess region from the gate electrode to a drain electrode side in the gate lengthwise direction is greater than a length of the recess region from the gate electrode to a source electrode side in the gate lengthwise direction.

In a configuration example of the method of manufacturing the field effect transistor, the method may further include an eighth step of forming an upper insulation layer on the insulation layer after the third step; and a ninth step of forming, before the fourth step, an upper gate opening in the upper insulation layer so as to be continuous to the gate opening formed in the insulation layer, and in the seventh step, a gate electrode is formed on the upper insulation layer, a part of the gate electrode being inserted into the recess region from the upper gate opening and the gate opening and being Schottky-joined to the barrier layer.

A field effect transistor according to another embodiment of the present invention includes: a buffer layer, a channel layer, a barrier layer, a carrier supply layer, and an ohmic cap layer formed on a semiconductor substrate; a source electrode and a drain electrode formed separate from each other on the ohmic cap layer; an insulation layer formed on the ohmic cap layer so as to be located between the source electrode and the drain electrode; a gate opening formed on the insulation layer so as to be located closer to the source electrode than to the drain electrode in the recess region in a plan view; a plurality of first openings, a second opening, and a third opening formed in the insulation layer so as to be located between the gate opening and the drain electrode in a plan view; a recess region in which a part of the ohmic cap layer including regions below the gate opening, the first openings, the second opening, and the third opening are removed in directions from the gate opening to the source electrode and to the drain electrode in a plan view; and a gate electrode formed above the insulation layer, a part of the gate electrode being inserted into the recess region from the gate opening and being Schottky-joined to the barrier layer. The plurality of first openings are arranged in a gate widthwise direction and each have a reed shape in a gate lengthwise direction in a plan view, the second opening has a reed shape in the gate widthwise direction in a plan view and is connected to a first opening of the plurality of first openings, the third opening is provided in a region outside of the arrangement of the plurality of first openings arranged in the gate widthwise direction, is connected to a first opening of the plurality of first openings at an end of the arrangement, and is formed in a shape that has a width that gradually broadens from the first opening at the end of the arrangement in a plan view, and a length of the recess region from the gate electrode to a drain electrode side in the gate lengthwise direction is greater than a length of the recess region from the gate electrode to a source electrode side in the gate lengthwise direction.

In a configuration example of the field effect transistor, one pair of the third openings are provided and are connected to the first openings at both ends of the arrangement of the plurality of first openings.

In a configuration example of the field effect transistor, the second opening is connected to a middle portion of the plurality of first openings in the gate lengthwise direction.

In a configuration example of the field effect transistor, the second opening is connected to one end of the plurality of first openings in the gate lengthwise direction.

In a configuration example of the field effect transistor, the second opening is alternately connected to one end and the other end of the plurality of first openings in the gate lengthwise direction.

In a configuration example of the field effect transistor, the field effect transistor further includes an upper insulation layer formed on the insulation layer; and an upper gate opening formed in the upper insulation layer so as to be continuous to the gate opening, and a part of the gate electrode is inserted into the recess region from the upper gate opening and the gate opening and is Schottky-joined to the barrier layer.

Effects of Embodiments of the Invention

As described above, according to embodiments of the present invention, the plurality of reed-shaped first openings arranged in the gate widthwise direction, the second openings connected to the adjacent first openings, and the third openings connected to a side away from the arrangement of the first openings at the end of the arrangement are used. Therefore, it is possible to form the asymmetric recess structure of the field effect transistor with more freedom of design and with better uniformity.

DETAILED DESCRIPTION OF ILLUSTRATIVE EMBODIMENTS

Hereinafter, a method of manufacturing a field effect transistor according to embodiments of the present invention will be described with reference to FIGS. 1A to 1I.

Figure 1A:
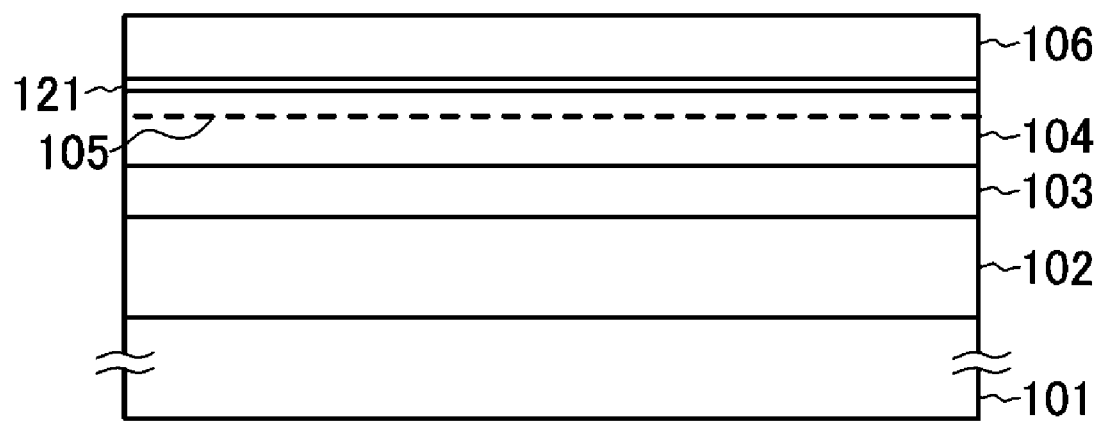
FIG. 1A is a cross-sectional view of a field effect transistor showing the state of a process in the course of manufacturing the field effect transistor according to an embodiment of the present invention.

First, as illustrated in FIG. 1A, a buffer layer 102, a channel layer 103, a barrier layer 104, a carrier supply layer 105, and an ohmic cap layer 106 are formed on a semiconductor substrate 101 including, for example, semi-insulating InP (a first step).

For example, the buffer layer 102 that includes InAlAs and has a layer thickness of 100 to 300 nm, the channel layer 103 that includes InGaAs and has a layer thickness of 5 to 20 nm, the barrier layer 104 that includes InAlAs and has a layer thickness of 5 to 20 nm, and the ohmic cap layer 106 that includes InGaAs doped with Si in the range of $1 \times 10^{19}$ to $2 \times 10^{19}$ cm$^{-3}$ are sequentially stacked on the semiconductor substrate 101 by crystal growth using an organometallic vapor growth method, a molecular beam epitaxial method, or the like. The carrier supply layer 105 doped with Si at $1 \times 10^{19}$ cm$^{-3}$ as impurities is formed on the barrier layer 104 by known sheet doping. Here, in the embodiment, a passivation layer 121 that includes InP and has a layer thickness of 2 to 5 nm is formed between the carrier supply layer 105 and the ohmic cap layer 106.

Figure 1B:
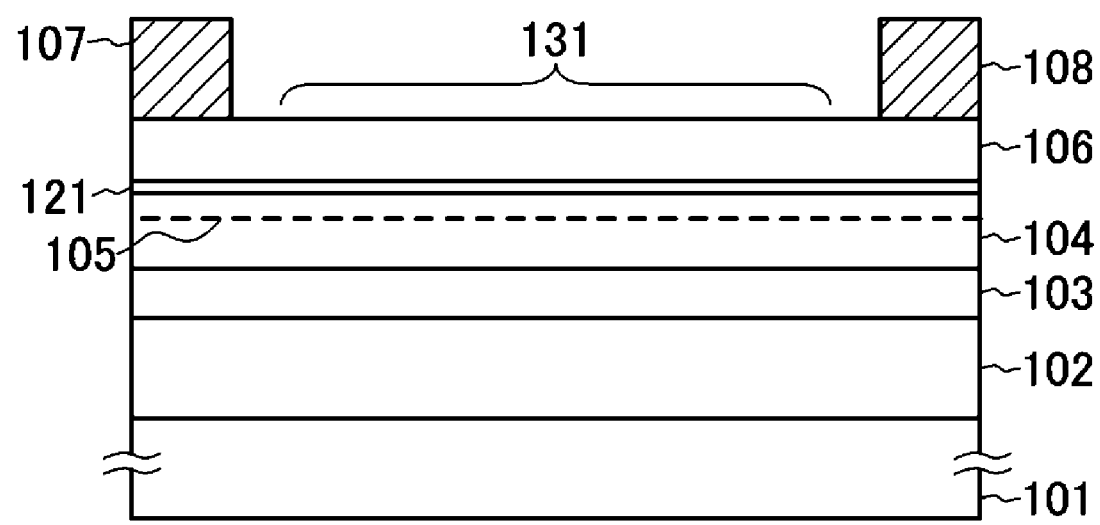
FIG. 1B is a cross-sectional view of the field effect transistor showing the state of a process in the course of manufacturing the field effect transistor according to an embodiment of the present invention.

Subsequently, as illustrated in FIG. 1B, a source electrode 107 and a drain electrode 108 are formed on the ohmic cap layer 106 to be separate from each other (a second step). The source electrode 107 and the drain electrode 108 are formed with a recess formation region 131, where the recess region is to be formed, interposed therebetween. The source electrode 107 and the drain electrode 108 are formed, for example, by depositing Ti/Pt/Au on the ohmic cap layer 106 to form a metal film and patterning the metal film by a known photolithographic technology and etching technology. The source electrode 107 and the drain electrode 108 can be formed also by a known lift-off method. The source electrode 107 and the drain electrode 108 are ohmic-contacted with the ohmic cap layer 106.

Figure 1C:
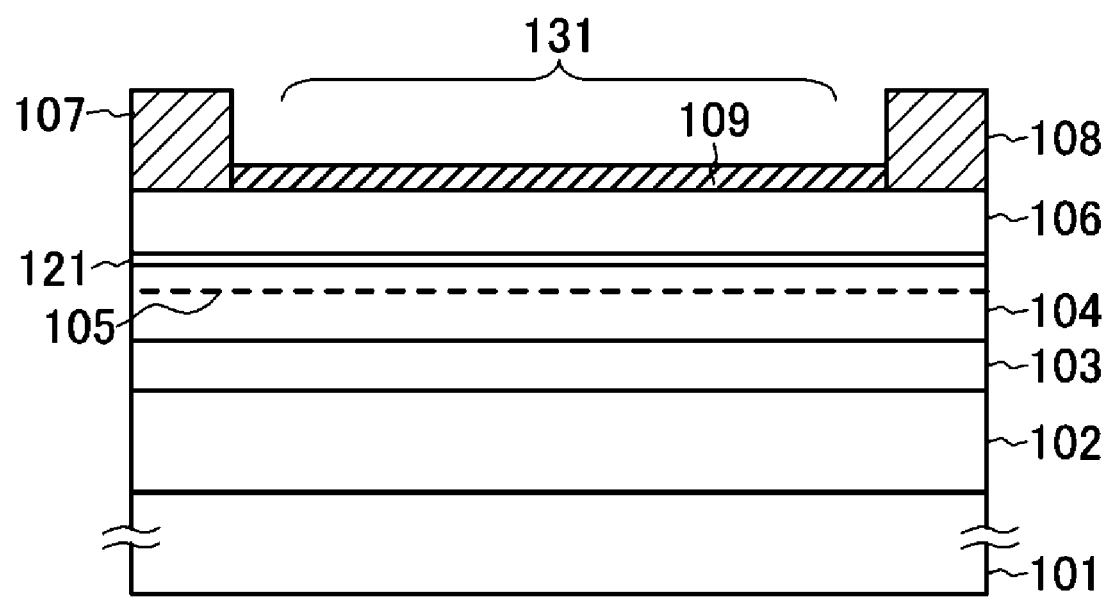
FIG. 1C is a cross-sectional view of the field effect transistor showing the state of a process in the course of manufacturing the field effect transistor according to an embodiment of the present invention.

Subsequently, as illustrated in FIG. 1C, an insulation layer 109 is formed on the ohmic cap layer 106 so as to be located between the source electrode 107 and the drain electrode 108 (a third step). For example, the insulation layer 109 that has a layer thickness of 20 to 200 nm is formed by depositing a silicon oxide or a silicon nitride by a known plasma CVD method.

Figure 1D:
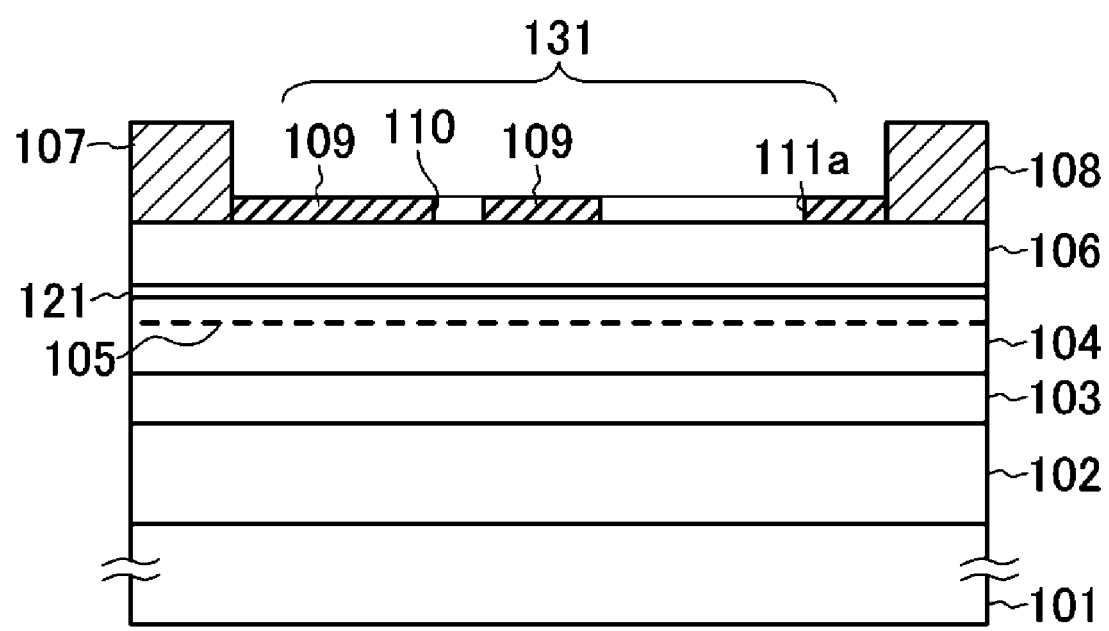
FIG. 1D is a cross-sectional view of the field effect transistor showing the state of a process in the course of manufacturing the field effect transistor according to an embodiment of the present invention.
Figure 1E:
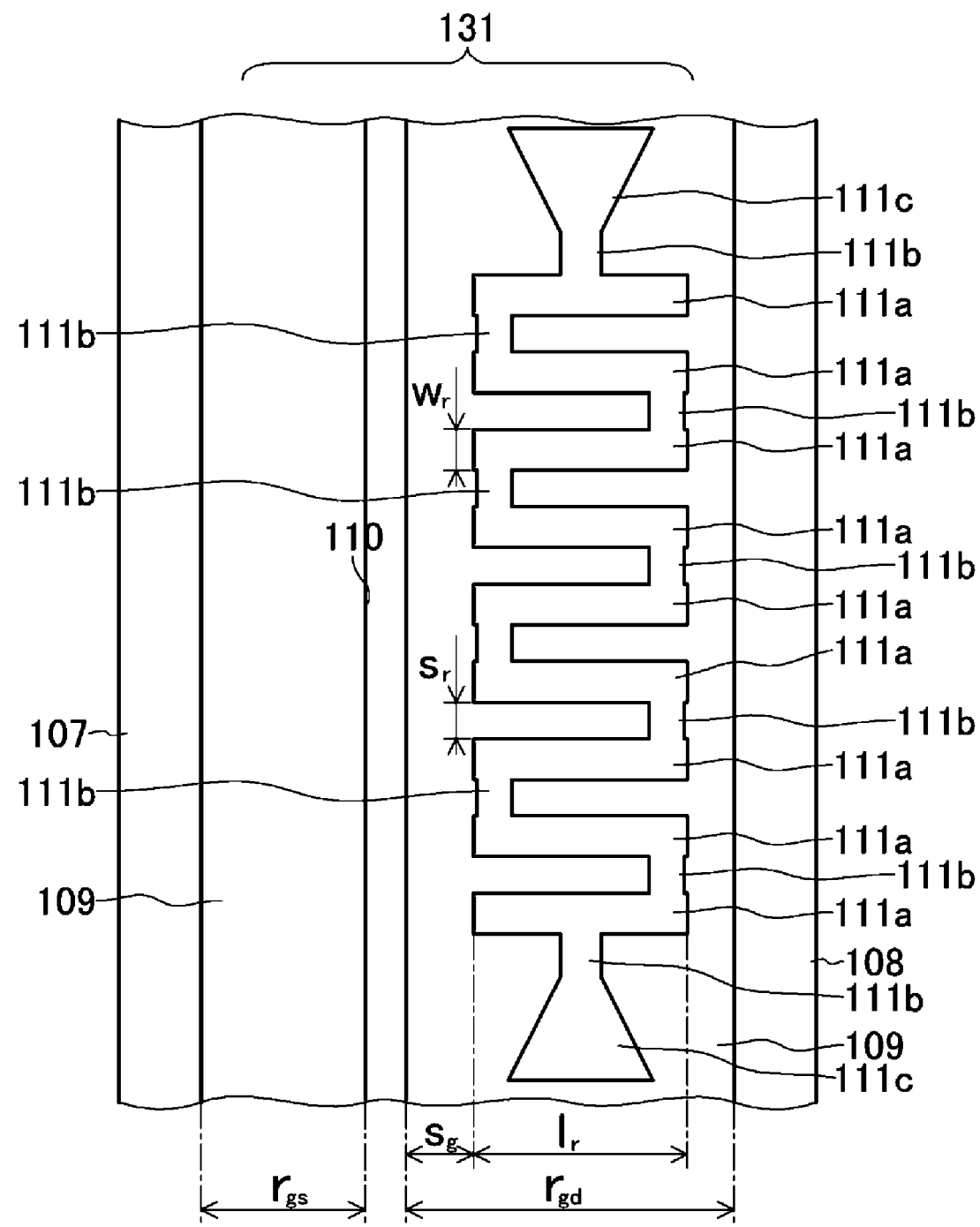
FIG. 1E is a plan view of the field effect transistor showing the state of a process in the course of manufacturing the field effect transistor according to an embodiment of the present invention.

Subsequently, as illustrated in FIGS. 1D and 1E, a gate opening 110 is formed in the insulation layer 109 so as to be located closer to the source electrode 107 than to the drain electrode 108 (a fourth step). The gate opening 110 is disposed within the recess formation region 131 such that a distance from the drain electrode 108 is greater than a distance from the source electrode 107. The gate opening 110 is a stripe-shaped (reed-shaped) opening along a gate widthwise direction (a normal direction of the paper surface of FIG. 1D).

First openings 111a, second openings 111b, and third openings 111c are formed between the gate opening 110 and the drain electrode 108 within the recess formation region 131 of the insulation layer 109 (a fifth step).

First, the plurality of first openings 111a are arranged in the gate widthwise direction and each have a reed shape along a gate lengthwise direction in a plan view.

The second openings 111b have a reed shape along the gate widthwise direction in a plan view and are connected to the plurality of first openings. The second openings 111b are connected to the adjacent first openings 111a.

The third openings 111c are provided in regions outside of the arrangement of the plurality of first openings 111a arranged in the gate widthwise direction, are connected to the first openings 111a arranged at ends, and are formed in a shape that has a width that gradually broadens from the first openings 111a arranged at the ends in a plan view. In the embodiment, one pair of third openings 111c are formed and connected to the first openings 111a arranged at both ends, as described above. In the embodiment, the third openings mc and the first openings 111a are connected by the second openings 111b.

The gate opening 110, the first openings 111a, the second openings 111b, and the third openings 111c are formed, for example, by a known electron beam lithographic technology and etching technology.

For example, the plurality of first openings 111a can be formed in the same shape. Similarly, for example, the plurality of second openings 111b can be formed in the same shape. Two third openings 111c can be formed in the same shape. For example, the plurality of first openings 111a can be formed and arranged in parallel in the gate widthwise direction. In the embodiment, for example, nine first openings 111a are formed, but the present invention is not limited thereto. The number of first openings 111a can be appropriately determined so that the first openings 111a are fitted in a desired recess shape.

Figure 1F:
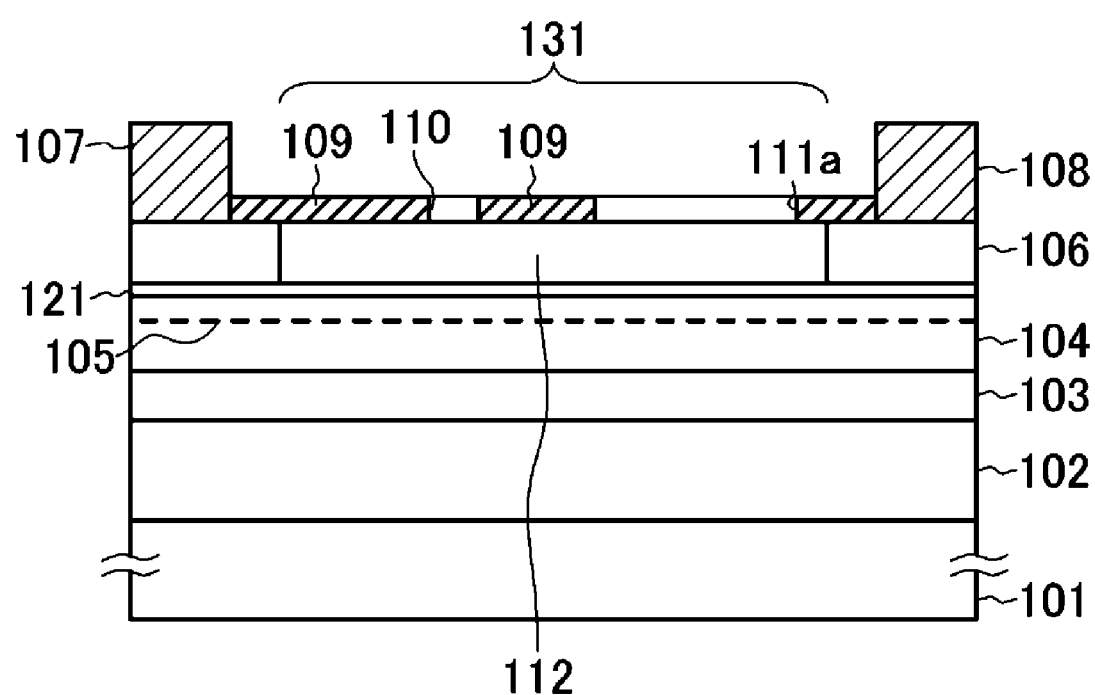
FIG. 1F is a cross-sectional view of the field effect transistor showing the state of a process in the course of manufacturing the field effect transistor according to an embodiment of the present invention.

Subsequently, as illustrated in FIG. 1F, the ohmic cap layer 106 is etched using the insulation layer 109 that has the gate opening 110, the first openings 111a, the second openings 111b, and the third openings 111c as a mask. Then, a recess region 112 in which a part of the ohmic cap layer 106 is removed in the directions from the gate opening 110 to the source electrode 108 and to the drain electrode 109 in a plan view is formed in a region below the gate opening 110, the first openings 111a, the second openings 111b, and the third openings 111c (a sixth step).

For example, the ohmic cap layer 106 is etched isotropically by pouring an etchant such as a citric acid from the regions of the above-described openings by wet etching using the etchant. Through this etching, the etchant erodes the ohmic cap layer 106 from each opening to form the recess region 112 which is one continuous space by expansion of the etching in a transverse direction. When the passivation layer 121 including InP is formed, InP is hardly etched by a citric-acid-based etchant. Therefore, the passivation layer 121 serves as an etching stopper, and thus the barrier layer 104 can be prevented from being etched.

In the forming of the above-described recess region 112, the first openings 111a, the second openings 111b, and the third openings 111c are formed when viewed in the gate lengthwise direction centering on the gate opening 110. Therefore, a space formed from the gate opening 110 to the drain side is formed to be broader than a space formed from the gate opening 110 to the source side. In this way, by providing the plurality of first openings 111a, the plurality of second openings 111b, and the plurality of third openings 111c, it is possible to form the recess region 112 that is asymmetric centering on the gate opening 110 without adding a new step.

The first openings 111a are used to form an asymmetric recess amount with high accuracy. The second openings 111b are used to spread the etchant to each of the first openings 111a equally. The third openings 111c are used to infiltrate the etchant to all the first openings 111a and the second openings 111b efficiently. The third openings 111c can also be formed outside of an outside element region located further outside of the region in which the gate opening 110 is formed in the gate widthwise direction. The source electrode 107 and the drain electrode 108 may be formed after the recess region 112 is formed and the manufacturing order is within the scope of the transistor manufacturing process examination.

The first openings 111a are arranged in the gate widthwise direction. An opening length or a formation interval of the first openings 111a in a gate lengthwise direction are determined in accordance with a length (a recess amount) of the recess region 112 in the gate lengthwise direction on the side of the drain electrode 108 and a length (a recess amount) of the recess region 112 in the gate lengthwise direction on the side of the source electrode 107. The recess amount corresponds to an etching amount of the ohmic cap layer 106. This point will be described in more detail with reference to FIGS. 1E and 1f.

Hereinafter, a length from the gate opening 110 to each of the source and drain sides in the gate lengthwise direction in the recess region 112 is referred to as a "recess width". For example, a "source-side recess width $r_{gs}$" is a length from the gate opening 110 to the source side in the gate lengthwise direction in the recess region 112. A "drain-side recess width $r_{gd}$" is a length from the gate opening 110 to the drain side in the gate lengthwise direction in the recess region 112.

The plurality of first openings 111a are arranged in the gate lengthwise direction between the gate opening 110 and the drain electrode 108. In accordance with an etching amount of the ohmic cap layer 106 for obtaining the target recess width $r_{gs}$ and recess width $r_{gd}$, an opening dimension $l_r$ of the first opening 111a in the gate lengthwise direction, an opening dimension $w_r$ of the first opening 111a in the gate widthwise direction, and an interval $s_r$ between the adjacent first openings 111a are determined.

The first openings 111a are formed in only one line to guarantee the intensity of the insulation layer 109 and are not formed in a plurality of lines as in Patent Literature 1. In principle, the source resistance is preferably as low as possible. Because the depletion due to the recess formation may increase the source resistance, an asymmetric recess formation opening is not formed on the source electrode side. Here, $s_g$ is a distance between the gate opening 110 and the first opening 111a.

The above described $r_{gd}$, $r_{gs}$, $s_g$, and $l_r$ have a relation of "$r_{gd} - r_{gs} = (s_g + l_r) \ldots (1)$". Here, to avoid the remainder of the recess etching, constraint conditions of "$r_{gd} \geq s_g \ldots (2)$" and "$r_{gd} \geq 0.5 s_r \ldots (3)$" are assumed to be satisfied.

By satisfying the above-described relations, it is possible to form the asymmetric recess structure without depending on an etching rate or an etching time of wet etching necessary to form an asymmetric recess. An etching rate and an etching time T in the formation of the asymmetric recess structure for satisfying the above-described relation and the constraint conditions are determined by "$r_{gs} = aT \ldots (4)$."

Etching amounts of a source electrode side recess region and a drain electrode side recess region are designed based on balance between an increase effect of parasitic resistance and a reduction effect of parasitic capacitance or drain conductance. For example, a general recess width is in the range of 20 to 200 nm on the source electrode side and is in the range of 50 to 500 nm on the drain electrode side. By forming the recess region within this range, it is possible to sufficiently reduce the drain conductance while sufficiently reducing source resistance. Thus, it is possible to achieve the asymmetric recess structure optimum for improving high-frequency characteristics.

For example, a design is assumed such that an asymmetric recess width satisfies $r_{gs} = 50$ nm on the source electrode side and $r_{gd} = 200$ nm on the drain electrode side. In this condition, the left side of Expression (1) is 150 nm, and thus the first openings 111a are formed in the insulation layer 109 so as to satisfy, for example, $s_g = 20$ nm and $l_r = 130$ nm. For a wet etching time necessary to form the asymmetric recess, for example, when the etching rate is 50 nm/min, an etching time of 60 sec is set in consideration of Expression (3).

As described above, the second openings 111b are connected to the adjacent first openings 111a and are formed to spread the etchant equally. The second opening 111b is formed so as to have an opening width substantially as large as the opening width of the first opening 111a. Here, when mechanical strength of the insulation layer 109 is desired to be improved, the width of the second opening 111*b* can be slimmer than the width of the first opening 111*a*. For example, the width of the second opening 111*b* can be set to ⅓ to ½ of the width of the first opening 111*a*.

By arranging such that the third opening 111*c* is in a tapered shape (a trapezoidal shape) in a plan view and has a width on the long side twice to three times as large as the width of the second opening 111*b*, it is possible to efficiently infiltrate the etchant from the third openings 111*c* to each of the first openings 111*a* and the second openings 111*b*.

As described above, by using the first openings 111*a*, the second openings 111*b*, and the third openings 111*c*, it is possible to uniformly infiltrate the etchant into the openings and get into the side of the ohmic cap layer 106 from the openings. As a result, it is possible to guarantee the uniformity and reproduction of the asymmetric recess which has been formed.

Figure 1G:
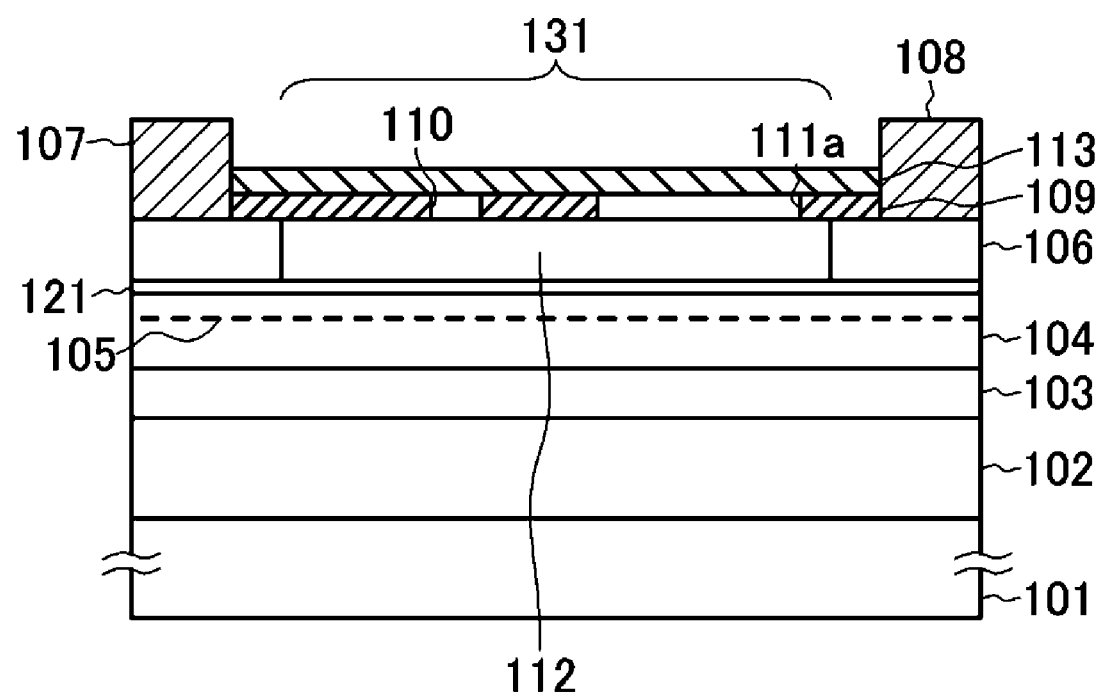
FIG. 1G is a cross-sectional view of the field effect transistor showing the state of a process in the course of manufacturing the field effect transistor according to an embodiment of the present invention.

Subsequently, as illustrated in FIG. 1G, an upper insulation layer 113 is formed on the insulation layer 109 (an eighth step). For example, the upper insulation layer 113 with a layer thickness of 20 to 200 nm is formed by depositing a silicon oxide or a silicon nitride by a plasma CVD method or the like.

Figure 1H:
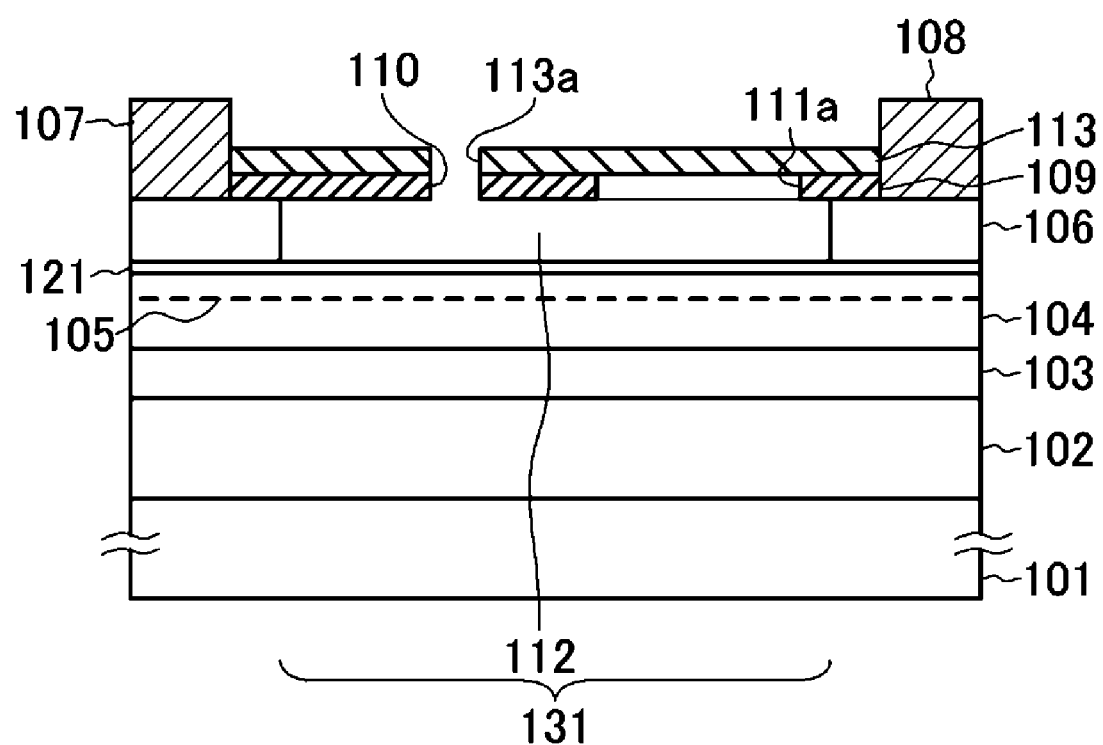
FIG. 1H is a cross-sectional view of the field effect transistor showing the state of a process in the course of manufacturing the field effect transistor according to an embodiment of the present invention.

Subsequently, as illustrated in FIG. 1H, an upper gate opening 113*a* is formed in the upper insulation layer 113 so as to be continuous to the gate opening 110 which is formed in the insulation layer 109 (a ninth step). The upper gate opening 113*a* is formed, for example, by a known electron beam lithographic technology and etching technology. Because the upper gate opening 113*a* is formed in the upper insulation layer 113, etching is performed to form the upper gate opening 113*a* such that the upper gate opening 113*a* penetrates the upper insulation layer 113. Therefore, the minute upper gate opening 113*a* can be formed.

Figure 1I:
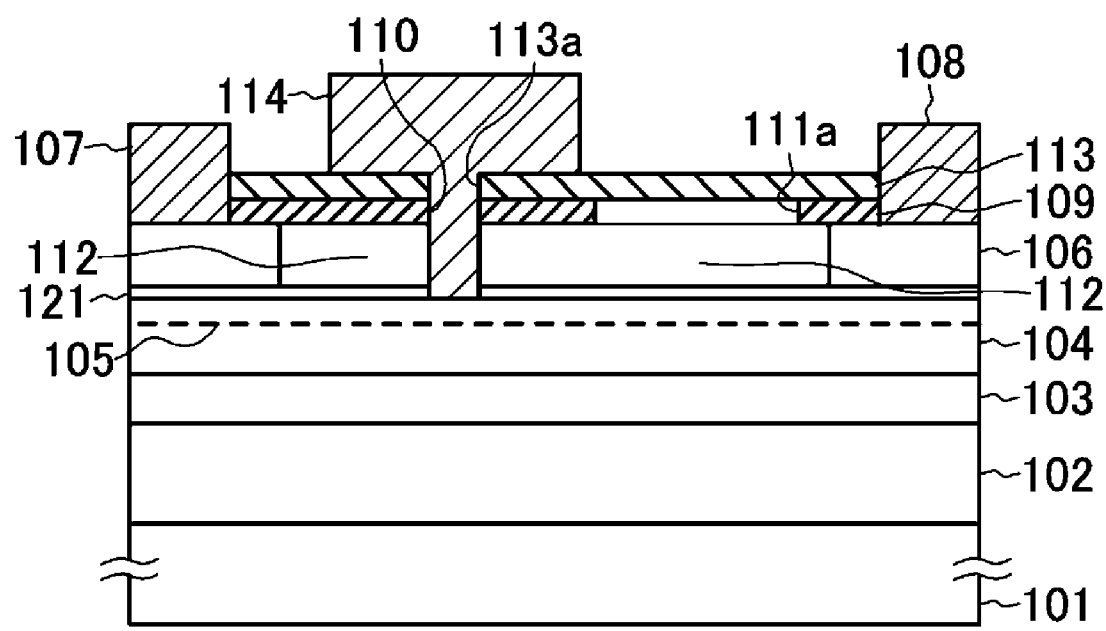
FIG. 1I is a cross-sectional view of the field effect transistor showing the state of a process in the course of manufacturing the field effect transistor according to an embodiment of the present invention.

Subsequently, a gate electrode 114 is formed (a seventh step). Here, as illustrated in FIG. 1I, the gate electrode 114 is disposed above the insulation layer 109 (disposed on the upper insulation layer 113), a part of the gate electrode 114 being inserted into the recess region 112 from the gate opening 110 and being Schottky-joined to the barrier layer 104. As described above, because a space formed on the drain side from the gate opening 110 is formed to be larger than a space formed on the source side from the gate opening 110, a length of the recess region 112 from the gate electrode 114 to the drain electrode side in the gate lengthwise direction is greater than a length of the recess region from the gate electrode 114 to the source electrode side in the gate lengthwise direction.

For example, a lift-off mask is formed such that a predetermined region including the gate opening 110 of the upper insulation layer 113 is opened and the other region including the source electrode 107 and the drain electrode 108 is coated. Subsequently, a gate metal material is deposited on the lift-off mask to form a metal film, and then the lift-off mask is removed (lifted off). In accordance with the lift-off method, the gate electrode 114 can be formed. In the above-described formation of the metal film, the metal deposited and getting into the gate opening 110 penetrates the considerably thin passivation layer 121 to be Schottky joined to the desired barrier layer 104 from the gate opening 110.

As described above, because the minute upper gate opening 113*a* (the gate opening 110) can be formed, it is possible to obtain the gate electrode 114 that is Schottky-joined and has a minute dimension in the gate lengthwise direction, and thus it is possible to realize good high-frequency characteristics. By forming the upper insulation layer 113 to block the first openings 111*a*, the second openings 111*b*, and the third openings 111*c*, it is possible to prevent the metal for the gate electrode from getting into the recess region 112. Therefore, it is possible to inhibit a reduction of parasitic capacitance or distortion of an electric field distribution.

It is possible to provide a function of modulating a channel immediately below a Schottky junction by a potential applied to the gate electrode 114 which is Schottky-joined to the barrier layer 104. The size (gate length) or shape of the gate electrode 114 is designed such that parasitic capacitance does not occur in each of the source electrode 107 and the drain electrode 108 and resistance of the entire gate electrode 114 is sufficiently low.

The gate electrode 114 includes a metal material such as Ni, W, or WSiN that has small thermal diffusion to the semiconductor substrate 101 and a large work function. The metal material can be deposited by a sputtering method, a vacuum evaporation method, an electroless plating method, an electrode plating method, or the like. A length (gate length) of the gate electrode 114 on a contact surface between the gate electrode 114 and the barrier layer 104 is generally in the range of 10 to 100 nm.

A distance from the end of the gate electrode 114 to the end of the source electrode 107 on the contact surface between the gate electrode 114 and the barrier layer 104 is at least equal to or greater than the recess width on the source side. A distance from the gate electrode 114 to the end of the drain electrode 108 is at least equal to or greater than the recess width of the drain side. In particular, to improve output characteristics of the transistor, it is also possible to set the distance from the gate electrode 114 to the end of the drain electrode 108 to be longer than the distance from the gate electrode 114 to the end of the source electrode 107.

Incidentally, as described above, after the first openings 111*a*, the second openings 111*b*, and the third openings 111*c* are formed in the insulation layer 109, the upper insulation layer 113 is formed, but the present invention is not limited thereto. For example, after the insulation layer 109 is formed and the upper insulation layer 113 is continuously formed, the gate opening 110, the first openings 111*a*, the second openings 111*b*, and the third openings 111*c* can also be formed. For example, the first openings 111*a*, the second openings 111*b*, and the third openings 111*c* are formed to penetrate the upper insulation layer 113 and the insulation layer 109, the recess region 112 is subsequently formed, and then the gate electrode 114 is formed. In this case, in the formation of the gate electrode 114, a metal layer is formed in the first openings 111*a*, the second openings 111*b*, and the third openings 111*c*.

Figure 2:
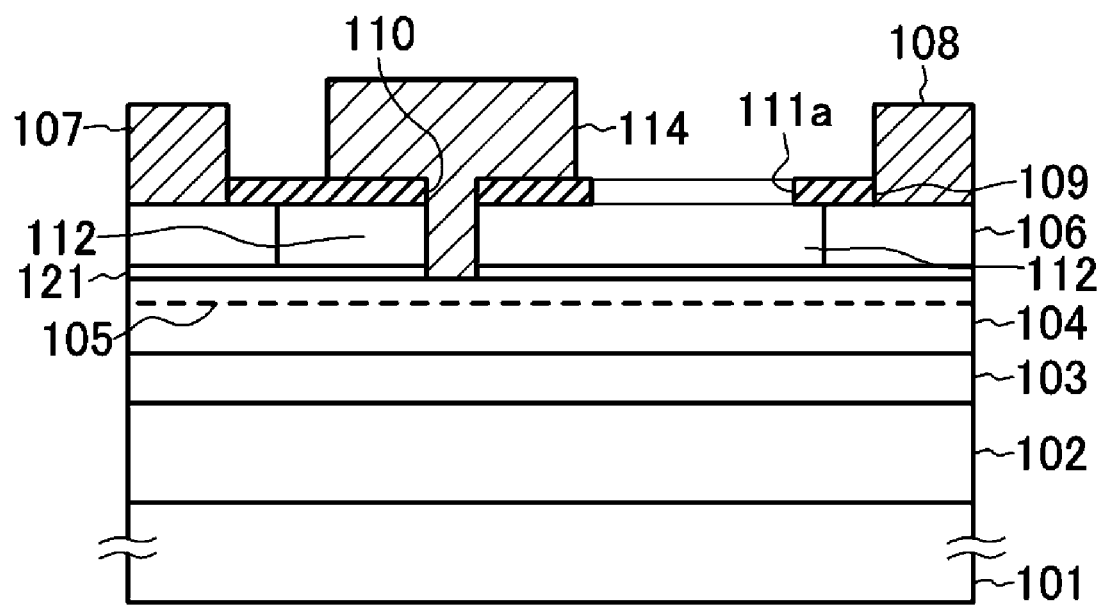
FIG. 2 is a cross-sectional view illustrating a configuration of another field effect transistor according to an embodiment of the present invention.

After the recess region 112 is formed using the insulation layer 109, the gate electrode 114 can also be formed without forming the upper insulation layer 113 (see FIG. 2). Even in this case, in the formation of the gate electrode 114, a metal layer is formed in the first openings 111*a*, the second openings 111*b*, and the third openings 111*c*. Here, by forming the first openings 111*a*, the second openings 111*b*, and the third openings 111*c* so as to have a width $w_r$, for example, equal to or less than 50 nm, and forming the gate electrode 114 by a sputtering method, it is possible to inhibit the metal from being deposited on the barrier layer 104 or the passivation layer 121 via the first openings 111*a*, the second openings 111*b*, and the third openings 111*c*.

Figure 3:
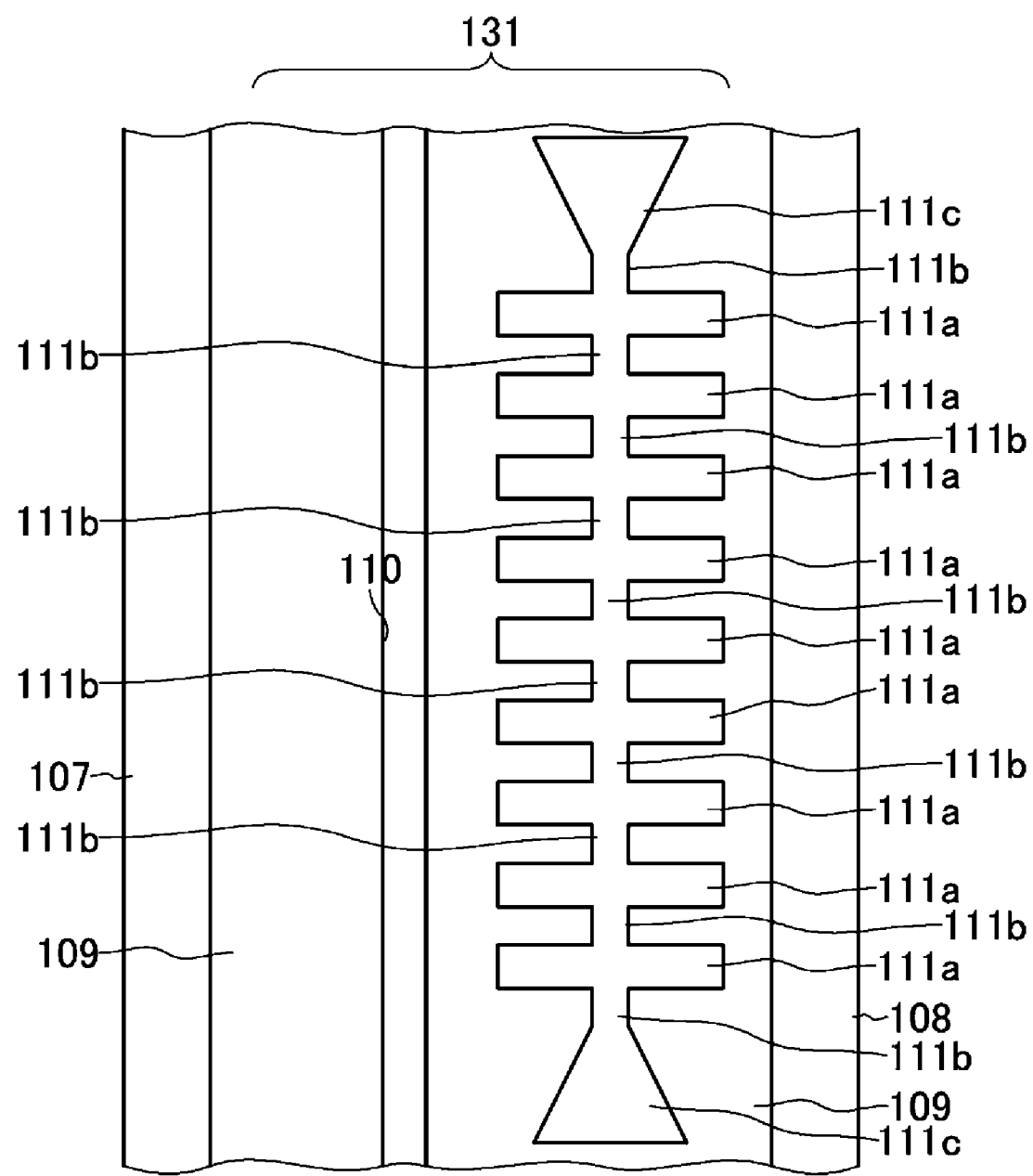
FIG. 3 is a plan view illustrating a configuration of still another field effect transistor according to an embodiment of the present invention.

As illustrated in FIG. 3, the second openings 111*b* can also be disposed in the middle portion of the first openings 111*a* in the gate lengthwise direction.

Figure 4:
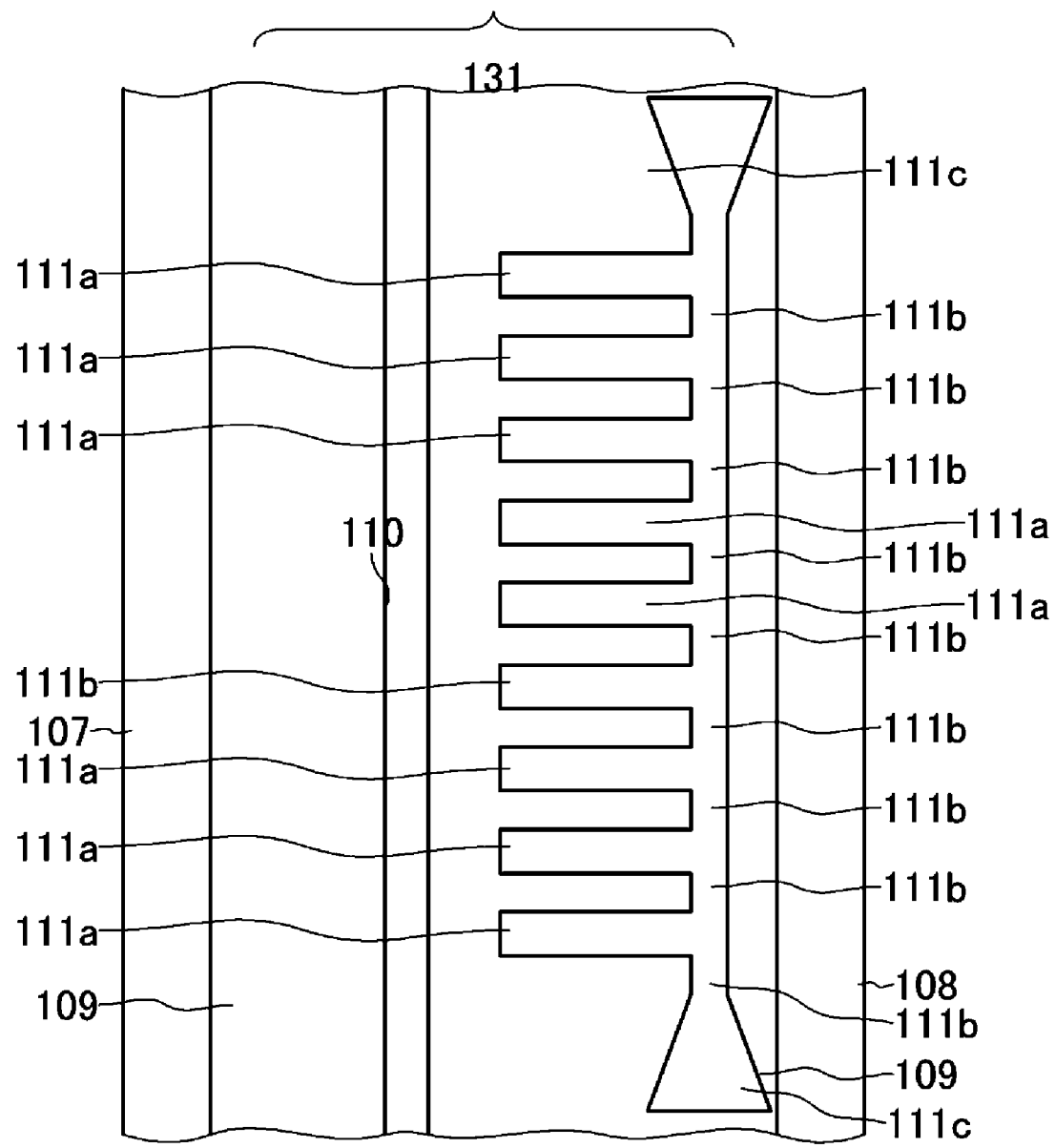
FIG. 4 is a plan view illustrating a configuration of still another field effect transistor according to an embodiment of the present invention.

As illustrated in FIG. 4, the second opening 111*b* can also be disposed at one end of the first opening 111*a* in the gate lengthwise direction. In the example illustrated in FIG. 4, the second opening 111b is disposed at one end of the first opening 111a away from the gate electrode 114. In this configuration, the upper portion of the gate electrode 114 does not interfere with the second openings 111b and the third openings 111c. Then, the gate electrode 114 can be disposed in a portion in which an area ratio is large and mechanical strength is high in the insulation layer 109, and thus it is possible to improve a yield of a device manufacturing.

Figure 5:
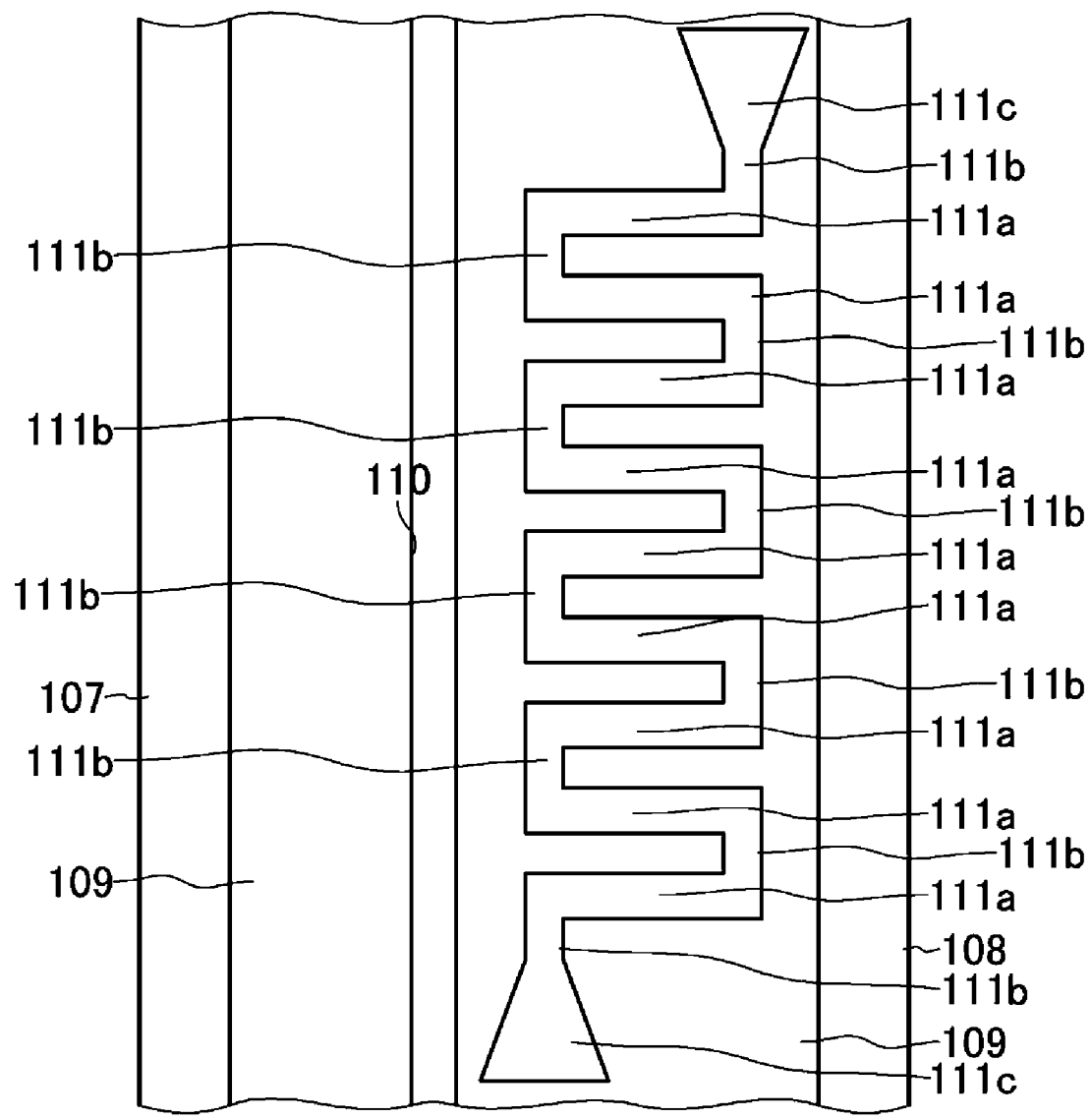
FIG. 5 is a plan view illustrating a configuration of still another field effect transistor according to an embodiment of the present invention.
Figure 6:
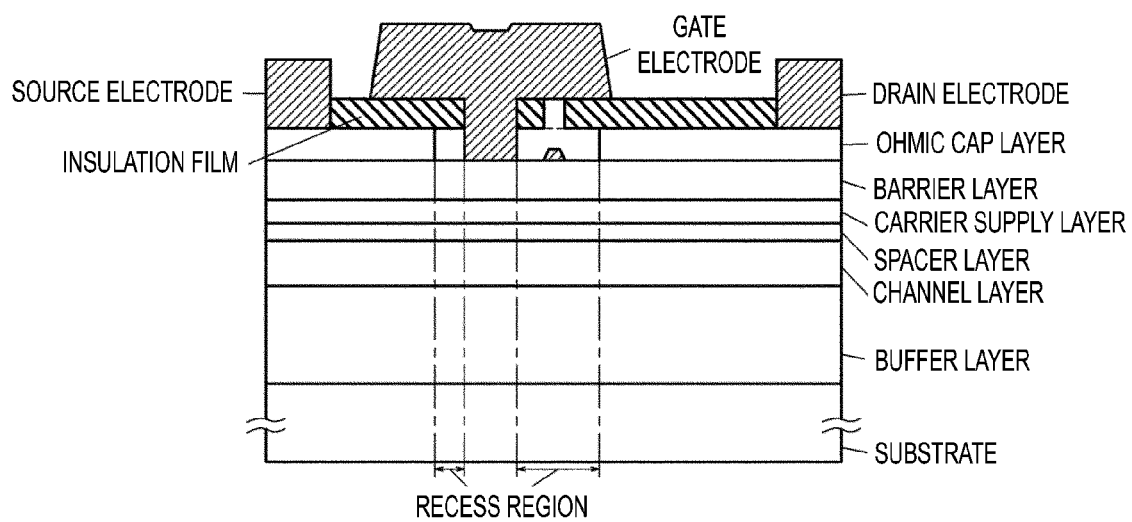
FIG. 6 is a cross-sectional view illustrating a configuration of a field effect transistor disclosed in Patent Literature 1.

As illustrated in FIG. 5, the second openings 111b can also be disposed alternately at one end and the other end of the first openings 111a in the gate lengthwise direction. In this case, an opening in which the first openings 111a and the second openings 111b are continuous is formed in a meandering shape. With this structure, it is possible to reduce occurrence of mechanical stress and bias in the insulation layer 109, and thus it is possible to improve a yield of device manufacturing.

As described above, according to embodiments of the present invention, the plurality of reed-shaped first openings arranged in the gate widthwise direction, the second openings connected to the adjacent first openings, and the third openings connected to a side away from the arrangement of the first openings at the end of the arrangement are used. Therefore, it is possible to form the asymmetric recess structure of the field effect transistor with more freedom of design and with better uniformity.

It should be apparent to those skilled in the art that the present invention is not limited to the above-described embodiments and many modifications and combinations can be made within the technical ideas of the present invention.

REFERENCE SIGNS LIST

101 Semiconductor substrate
102 Buffer layer
103 Channel layer
104 Barrier layer
105 Carrier supply layer
106 Ohmic cap layer
107 Source electrode
108 Drain electrode
109 Insulation layer
110 Gate opening
111a First opening
111b Second opening
111c Third opening
112 Recess region
113 Upper insulation layer
113a Upper gate opening
114 Gate electrode
121 Passivation layer
131 Recess formation region

The invention claimed is:

1. A method for manufacturing a field effect transistor, the method comprising:
   a first step of forming a buffer layer, a channel layer, a barrier layer, a carrier supply layer, and an ohmic cap layer on a semiconductor substrate;
   a second step of forming a source electrode and a drain electrode separate from each other on the ohmic cap layer;
   a third step of forming an insulation layer located between the source electrode and the drain electrode on the ohmic cap layer;
   a fourth step of forming a gate opening located closer to the source electrode than to the drain electrode on the insulation layer;
   a fifth step of forming a plurality of first openings, a second opening, and a third opening located between the gate opening and the drain electrode in the insulation layer;
   a sixth step of forming, in regions below the gate opening, the plurality of first openings, the second opening, and the third opening, a recess region in which a part of the ohmic cap layer is removed in directions from the gate opening to the source electrode and to the drain electrode in a plan view by etching the ohmic cap layer using the insulation layer that has the gate opening, the first openings, the second opening, and the third opening as a mask; and
   a seventh step of forming a gate electrode above the insulation layer, a part of the gate electrode being inserted into the recess region from the gate opening and being Schottky-joined to the barrier layer;
   wherein the first openings are arranged in a gate widthwise direction with each having a reed shape in a gate lengthwise direction in the plan view;
   wherein the second opening has the reed shape in the gate widthwise direction in the plan view and is connected to one first opening of the plurality of first openings;
   wherein the third opening is provided in a region outside of an arrangement of the plurality of first openings arranged in the gate widthwise direction, is connected to another first opening of the plurality of first openings at an end of the arrangement, and is formed in a shape that has a width that gradually broadens from the another first opening at the end of the arrangement in the plan view; and
   wherein a length of the recess region from the gate electrode to a drain electrode side in the gate lengthwise direction is greater than a length of the recess region from the gate electrode to a source electrode side in the gate lengthwise direction.

2. The method according to claim 1, further comprising:
   an eighth step of forming an upper insulation layer on the insulation layer after the third step; and
   a ninth step of forming an upper gate opening in the upper insulation layer so as to be continuous to the gate opening formed in the insulation layer, wherein, in the seventh step, the gate electrode is formed on the upper insulation layer, a part of the gate electrode being inserted into the recess region from the upper gate opening and the gate opening and being Schottky-joined to the barrier layer.

3. A field effect transistor comprising:
   a buffer layer, a channel layer, a barrier layer, a carrier supply layer, and an ohmic cap layer on a semiconductor substrate;
   a source electrode and a drain electrode separate from each other on the ohmic cap layer;
   an insulation layer on the ohmic cap layer between the source electrode and the drain electrode;
   a gate opening on the insulation layer located closer to the source electrode than to the drain electrode in a plan view;
   a plurality of first openings, a second opening, and a third opening in the insulation layer between the gate opening and the drain electrode in the plan view;
   a recess region in which a part of the ohmic cap layer including regions below the gate opening, the first openings, the second opening, and the third opening are removed in directions from the gate opening to the source electrode and to the drain electrode in the plan view; and a gate electrode above the insulation layer, a part of the gate electrode being inserted into the recess region from the gate opening and being Schottky-joined to the barrier layer;

wherein the first openings are arranged in a gate widthwise direction with each having a reed shape in a gate lengthwise direction in the plan view;

wherein the second opening has the reed shape in the gate widthwise direction in the plan view and is connected to one first opening of the plurality of first openings;

the third opening is in a region outside of an arrangement of the plurality of first openings arranged in the gate widthwise direction, is connected to another first opening of the plurality of first openings at an end of the arrangement, and is formed in a shape that has a width that gradually broadens from the another first opening at the end of the arrangement in the plan view; and a length of the recess region from the gate electrode to a drain electrode side in the gate lengthwise direction is greater than a length of the recess region from the gate electrode to a source electrode side in the gate lengthwise direction.

4. The field effect transistor according to claim 3, wherein one pair of the third openings are provided and are connected to the first openings at both ends of the arrangement of the plurality of first openings.

5. The field effect transistor according to claim 3, wherein the second opening is connected to a middle portion of the plurality of first openings in the gate lengthwise direction.

6. The field effect transistor according to claim 3, wherein the second opening is connected to one end of the plurality of first openings in the gate lengthwise direction.

7. The field effect transistor according to claim 3, wherein the second opening is alternately connected to a first end and a second end of the plurality of first openings in the gate lengthwise direction.

8. The field effect transistor according to claim 3, further comprising:

an upper insulation layer on the insulation layer; and an upper gate opening in the upper insulation layer that is continuous with the gate opening, wherein a part of the gate electrode is inserted into the recess region from the upper gate opening and the gate opening and is Schottky-joined to the barrier layer.

* * * * *